US006622269B1

(12) United States Patent
Ngo et al.

(10) Patent No.: US 6,622,269 B1
(45) Date of Patent: Sep. 16, 2003

(54) MEMORY FAULT ISOLATION APPARATUS AND METHODS

(75) Inventors: Nguyen N. Ngo, Portland, OR (US); Chih-Jen Lin, Austin, TX (US)

(73) Assignee: Intel Corporation, Santa Clara, CA (US)

( * ) Notice: Subject to any disclaimer, the term of this patent is extended or adjusted under 35 U.S.C. 154(b) by 436 days.

(21) Appl. No.: 09/723,010

(22) Filed: Nov. 27, 2000

(51) Int. Cl.$^7$ .............................................. G11C 29/00
(52) U.S. Cl. ...................... 714/718; 714/719; 714/723
(58) Field of Search ................................ 712/205, 217, 712/216; 365/201; 714/718, 719, 723, 733

(56) References Cited

U.S. PATENT DOCUMENTS

| 5,185,871 A | * | 2/1993 | Frey et al. .................... 712/205 |
| 5,487,156 A | * | 1/1996 | Popescu et al. .............. 712/217 |
| 5,627,983 A | * | 5/1997 | Popescu et al. .............. 712/217 |
| 5,640,509 A | | 6/1997 | Balmer et al. .......... 395/183.18 |
| 5,699,536 A | * | 12/1997 | Hopkins et al. ............. 712/216 |
| 5,883,843 A | * | 3/1999 | Hii et al. ..................... 365/201 |

* cited by examiner

*Primary Examiner*—David Ton
(74) *Attorney, Agent, or Firm*—Schwegman, Lundberg, Woessner & Kluth, P.A.

(57) ABSTRACT

Improved apparatus and methods for performing programmable built-in self-testing (PBIST) of memory serve to capture failure information while minimizing the silicon area used for implementation. Rather than saving all data subsequent to the first detection of a memory failure, on-chip storage elements save command, address, and program counter values corresponding to the instruction generating the first memory failure as well as to a number of subsequent instructions, but only a single memory block of data values is saved. The total silicon area of the elements that store the command, address, program counter, and data values is significantly less than that required to save all data corresponding to the first and subsequent faulty read operations. Methods of operation, as well as application of the apparatus to an electronic assembly, an electronic system, and a data processing system, are also described.

30 Claims, 7 Drawing Sheets

MEMORY FAULT ISOLATION APPARATUS AND METHODS

TECHNICAL FIELD OF THE INVENTION

The present invention relates generally to the field of semiconductors and, more particularly, to improved apparatus and methods for testing memory elements on integrated circuits.

BACKGROUND OF THE INVENTION

Integrated circuits (ICs) are typically assembled into packages by physically and electrically coupling them to a substrate. One or more IC packages can be physically and electrically coupled to a printed circuit board (PCB) to form an "electronic assembly". An "electronic assembly" can be part of an "electronic system". An "electronic system" is broadly defined herein as any product comprising an "electronic assembly". Examples of electronic systems include computers (e.g., desktop, laptop, hand-held, server, etc.), wireless communications devices (e.g., cellular phones, cordless phones, pagers, etc.), computer-related peripherals (e.g., printers, scanners, monitors, etc.), entertainment devices (e.g., televisions, radios, stereos, tape and compact disc players, video cassette recorders, MP3 (Motion Picture Experts Group, Audio Layer 3) players, etc.), and the like.

Integrated circuits (ICs) typically contain one or more functional logic blocks (FLBs), such as a microprocessor, microcontroller, graphics processor, bus interface circuit, input/output (I/O) circuit, memory circuit, and the like. It is well known to provide combinations of FLBs that include one or more memory circuits. Such combinations can be provided on one or more ICs. For example, such a combination could include a microprocessor and a memory circuit on a single IC or on separate ICs. One such combination known in the art is a microprocessor and a cache memory on a single IC. Other combinations of processors and memory circuits are also known.

In the field of electronic systems there is an incessant competitive pressure among manufacturers to drive the performance of their equipment up while driving down production costs. This is particularly true regarding the testing of ICs. ICs must generally be tested before they are incorporated into an electronic assembly in order to verify that each component of each FLB, including any memory circuit, on the IC functions properly. It is desirable to thoroughly test ICs while at the same time minimizing the cost, time, and complexity of testing.

In testing memory circuits, it is known to employ a type of testing referred to as programmable built-in self-test (PBIST), as described for example in U.S. Pat. No. 5,640,509, assigned to the assignee of the present invention. According to one embodiment of U.S. Pat. No. 5,640,509, a PBIST circuit is provided as part of an IC that also includes a memory circuit. The PBIST circuit comprises a set of programmable registers that determine a test sequence to be performed on the memory circuit.

When a PBIST circuit determines that a memory failure has occurred, it is desirable to capture and examine not only the set of command, address, and data values corresponding to the read operation that generated the first mismatch, but also the same information for several subsequent read operations that were in the memory and PBIST pipelines when the failure was first detected. In prior art PBIST circuits, the circuitry for capturing several sets of command, address, and data values consumes a relatively large portion of the IC containing the PBIST circuits.

For the reasons stated above, and for other reasons stated below which will become apparent to those skilled in the art upon reading and understanding the present specification, there is a significant need in the art for a PBIST circuit that occupies minimal silicon area, as well as for methods of operating such a PBIST circuit.

DETAILED DESCRIPTION OF EMBODIMENTS OF THE INVENTION

In the following detailed description of embodiments of the invention, reference is made to the accompanying drawings which form a part hereof, and in which is shown by way of illustration specific preferred embodiments in which the inventions may be practiced. These embodiments are described in sufficient detail to enable those skilled in the art to practice the invention, and it is to be understood that other embodiments may be utilized and that logical, mechanical, and electrical changes may be made without departing from the spirit and scope of the present inventions. The following detailed description is, therefore, not to be taken in a limiting sense, and the scope of the present invention is defined only by the appended claims.

The present invention provides a solution to the relatively large amount of silicon area that was required to implement prior art PBIST circuits for testing memory circuits. Various embodiments are illustrated and described herein. In one embodiment, rather than saving all data subsequent to the first detection of a memory failure, the command, address, and program counter values are saved corresponding to the instruction generating the first memory failure as well as to several subsequent instructions.

However, only a single memory block of data values is saved. The silicon area of the elements that store the command, address, and program counter values is significantly less than that required to save all data corresponding to the first and subsequent faulty read operations. Methods of operation, as well as application of the apparatus to an electronic assembly, an electronic system, and a data processing system, are also described.

In addition to the foregoing advantages, the improved memory testing apparatus and methods of the present invention can be utilized in one embodiment while the memory circuit under test is operated at full operational speed. This is important in order to detect any memory circuit failures that occur only at full operational speed.

Figure 1:
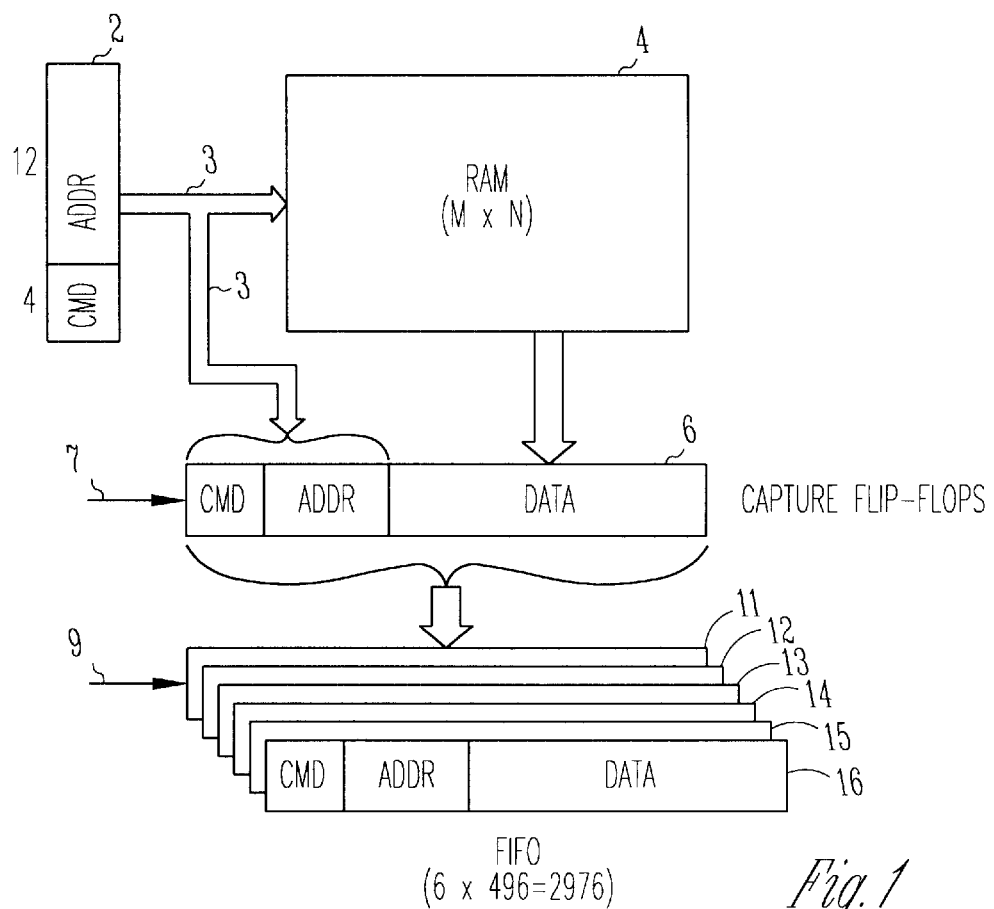
FIG. 1 illustrates a block diagram of a portion of a prior art PBIST circuit.

FIG. 1 illustrates a block diagram of a portion of a prior art PBIST circuit. It includes registers for capturing all command, address, and data values subsequent to the first detection of a memory failure. Register 2 is a command/address register comprising a command (CMD) portion and an address (ADDR) portion. Merely as an example, the CMD portion is depicted as 4 bits wide, and the ADDR portion is depicted as 12 bits wide. Random access memory (RAM) 4 is illustrated as an M-by-N memory array. In the example shown, RAM 4 is a 4096-by-480 memory array. RAM 4 is addressable via bus 3 by the 4-bit CMD and the 12-bit ADDR values.

The PBIST circuit (only a portion of which is illustrated) performs one or more memory tests upon RAM 4, as explained in greater detail in U.S. Pat. No. 5,640,509. For example, after writing a particular data value to a memory location, the data is read from the location, and if a fault is detected (i.e. the data that is read differs from the data that was written, as determined by a comparison circuit) a memory fault signal is generated.

Upon occurrence of a memory fault signal, the 4-bit CMD, 12-bit ADDR, and 480-bit data values at this instant are captured in the appropriate CMD, ADDR, and DATA portions of capture flip-flops 6. Latch input 7 of capture flip-flops 6 is responsive to a latch signal that is generated by suitable circuitry (not illustrated) in response to a memory fault signal.

Subsequently, as mentioned earlier, a sequence of the same sets of command, address, and data values is captured for the next few memory read cycles. In the example shown in FIG. 1, each set of command, address, and data values is sequentially stored in, for example, a six-deep set of first-in-first-out (FIFO) registers 11–16. For this example, the total storage requirement is 4+12+480=496 * 6=2976 bits. The storage and shifting of command, address, and data values into and through FIFO registers 11–16 are controlled by suitable circuitry (not illustrated) that provides control signals to one or more control inputs 9.

Figure 2:
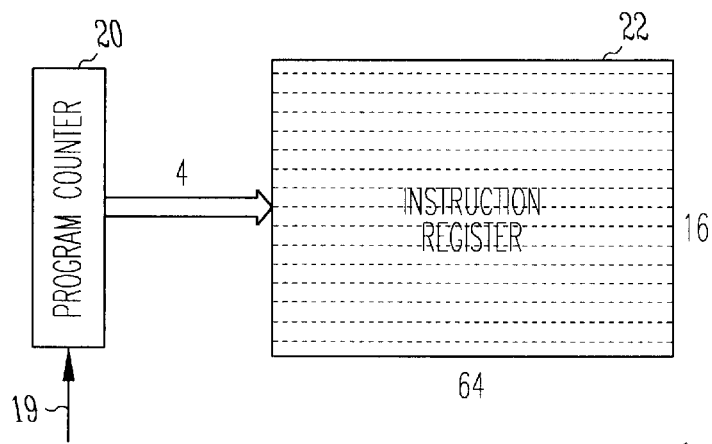
FIG. 2 illustrates another portion of a prior art PBIST circuit.

FIG. 2 illustrates another portion of a prior art PBIST circuit. It includes circuitry for capturing only the one program counter value corresponding to the last instruction executed before the PBIST engine stops. In a known prior art circuit, an instruction register 20 holds a value that indicates which instruction within instruction register 22 is the next instruction to be executed. In the example shown, the instruction register 22 comprises 16 instructions, each 64 bits in length, and the program counter 20 comprises a 4-bit value. Upon the occurrence of a memory fault signal, a latch signal applied to latch input 19 latches the value currently in the program counter 20 for later examination. The value latched in program counter 20 points to the last instruction that was executed before the PBIST engine stopped. It will be noted that only one program counter value is latched in the prior art PBIST circuit.

Figure 3:
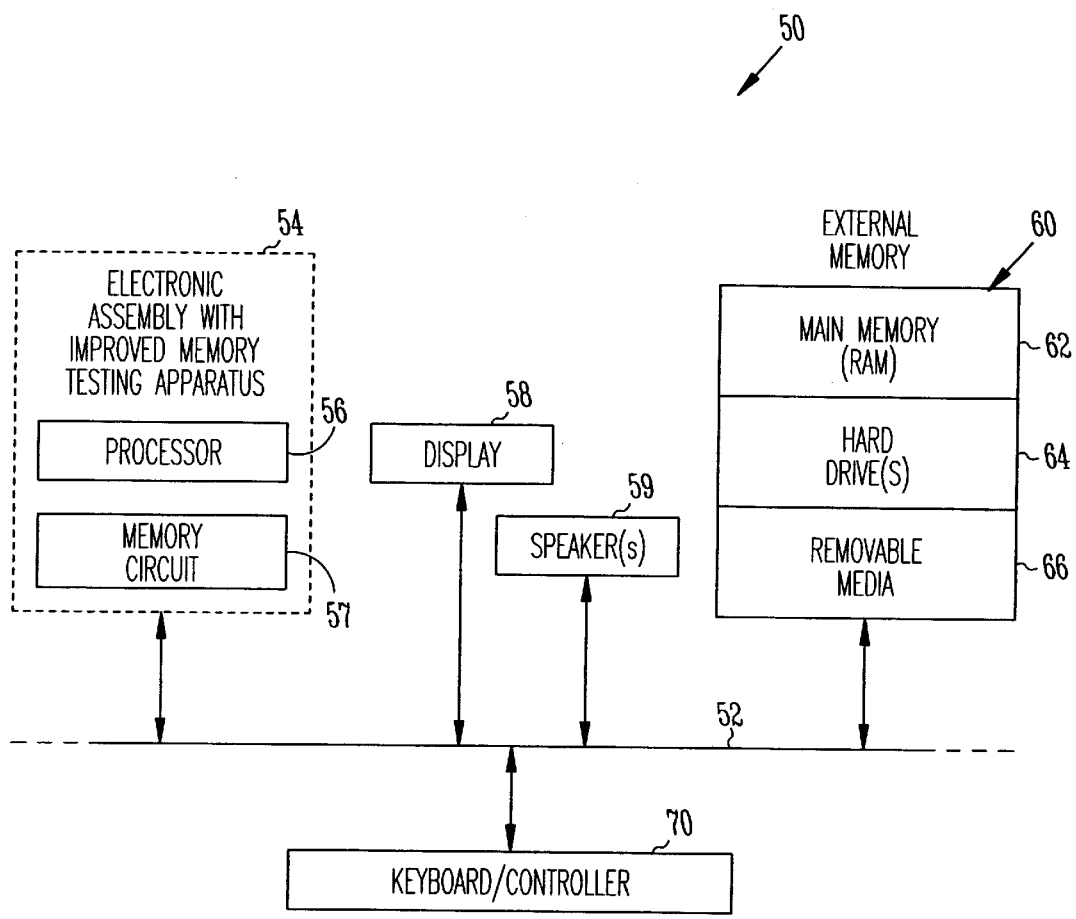
FIG. 3 is a block diagram of an electronic system incorporating at least one electronic assembly with an improved memory testing apparatus in accordance with one embodiment of the invention.

FIG. 3 is a block diagram of an electronic system 50 incorporating at least one electronic assembly 54 with an improved memory testing apparatus in accordance with one embodiment of the invention. Electronic system 50 is merely one example of an electronic system in which the present invention can be used. In this example, electronic system 50 is a data processing system that includes a system bus 52 to couple the various components of the system.

System bus 52 provides communications links among the various components of the electronic system 50 and can be implemented as a single bus, as a combination of busses, or in any other suitable manner.

Electronic assembly 54 is coupled to system bus 52. Electronic assembly 54 can include any circuit or combination of circuits. In one embodiment, electronic assembly 54 includes a processor 56 which can be of any type. As used herein, "processor" means any type of computational circuit, such as but not limited to a microprocessor, a microcontroller, a complex instruction set computing (CISC) microprocessor, a reduced instruction set computing (RISC) microprocessor, a very long instruction word (VLIW) microprocessor, a graphics processor, a digital signal processor (DSP), an application-specific integrated circuit (ASIC), a communication circuit, an artificial intelligence circuit, neural network, or any other type of circuit for performing processing functions of any type, or a combination of such computational circuits.

Also included in electronic assembly 54 is a memory circuit 57 of any suitable type. In addition, electronic assembly 54 can comprise one or more additional circuits, such as a communications circuit (not shown) for use in wireless devices like cellular telephones, pagers, portable computers, two-way radios, and similar electronic systems. Electronic assembly 54 can perform any other type of function. The functional logic blocks (FLBs) of electronic assembly 54 can be implemented on one IC or on two or more ICs.

Electronic system 50 can also include an external memory 60, which in turn can include one or more memory elements suitable to the particular application, such as a main memory 62 in the form of random access memory (RAM), one or more hard drives 64, and/or one or more drives that handle removable media 66 such as floppy diskettes, compact disks (CDs), digital video disks (DVDs), and the like.

Electronic system 50 can also include a display device 58, one or more speakers 59, and a keyboard and/or controller 70, which can include a mouse, trackball, game controller, voice-recognition device, or any other device that permits a system user to input information into and receive information from the electronic system 50.

Figure 4:
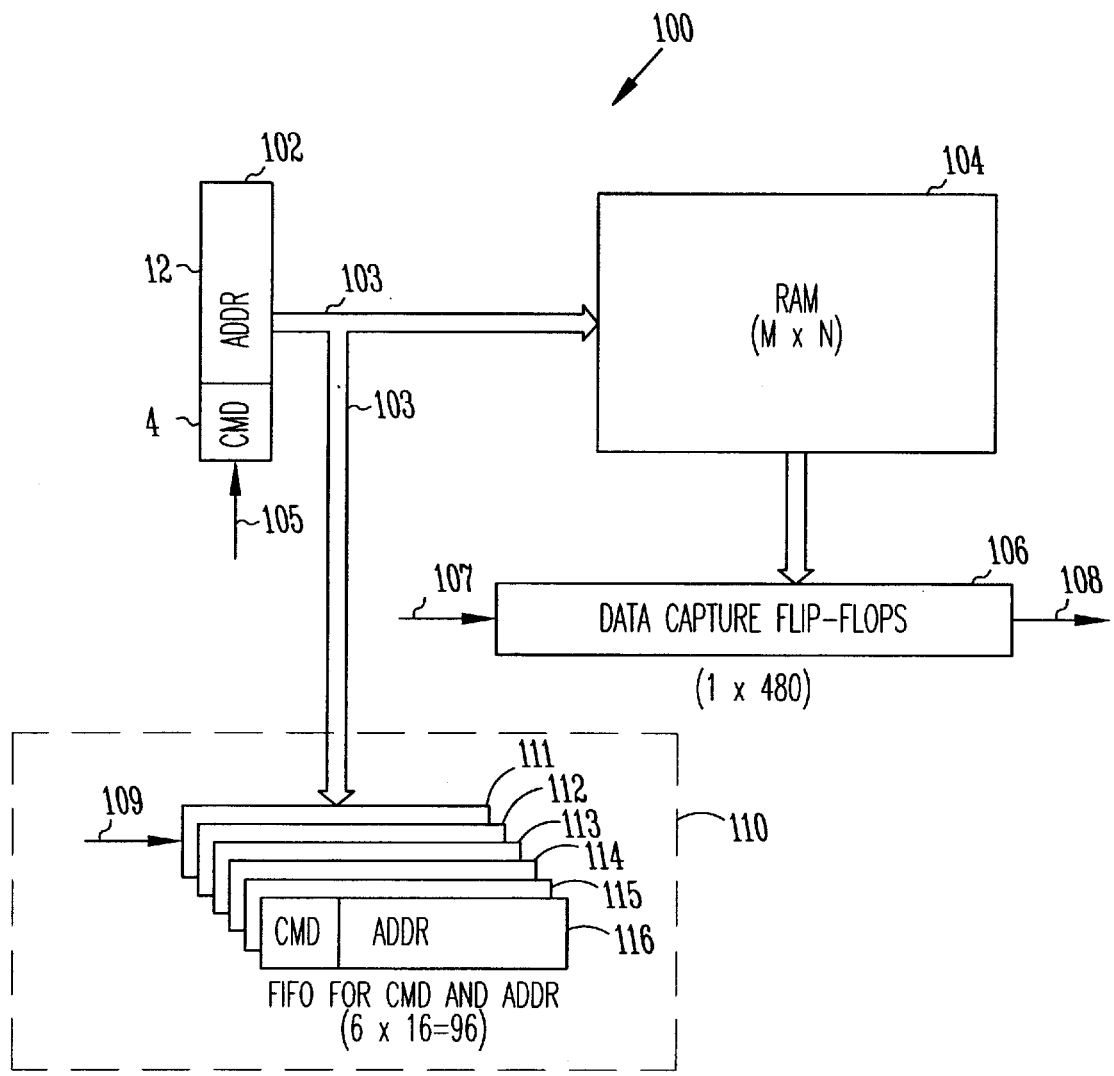
FIG. 4 illustrates a portion of an improved PBIST circuit, in accordance with one embodiment of the invention.

FIG. 4 illustrates a portion of an improved PBIST circuit 100, in accordance with one embodiment of the invention. Similar to the known PBIST circuit described with reference to FIG. 1, the improved PBIST circuit 100 includes a command/address register 102 and a RAM 104. Merely as an example, the command/address register 102 comprises a 4-bit CMD portion and a 12-bit ADDR portion, and RAM 104 is illustrated as an M-by-N memory array, where M and N are positive integers. In one embodiment, RAM 104 is a 4096-by-480 memory array. RAM 104 is addressable via bus 103 by the 4-bit CMD and 12-bit ADDR values stored in command/address register 102.

Similar to the known PBIST circuit, improved PBIST circuit 100 captures several (e.g. six, in the example shown) sets of command and address values subsequent to the first detection of a memory failure. It does this by successively storing the command and address values that appear in the command/address register 102 into a FIFO store 110 via bus 103. FIFO store 110 comprises a plurality (e.g. six, in the example illustrated) of FIFO registers 111–116. For this example, the total storage requirement is 4+12=16*6=96 bits. The storage of command and address values into and through FIFO registers 111–116 is controlled by suitable circuitry (not illustrated) that provides control signals to one or more control inputs 105 on command/address register 102 and to one or more control inputs 109 on FIFO registers 111–116. The number of FIFO registers in FIFO store 110 is not limited to six, and it can be any suitable number that enables a sufficient number of command/address values to be captured and analyzed without requiring an excessive amount of silicon area for its implementation.

However, improved PBIST circuit 100 differs significantly from the known PBIST circuit by capturing only one data block, or set of data values, at a time in a data capture storage element, which in one embodiment is implemented as data capture flip-flops 106. In response to generation of a latch signal that is generated by suitable circuitry (not illustrated) in response to a memory fault signal, latch input 109 of data capture flip-flops 106 latches the N-bit data value (480 bits in the example shown) corresponding to the memory fault. The 480-bit data value can be subsequently shifted out of data capture flip-flops 106 via bus 108 at a later time for analysis, as will be explained in greater detail below.

Concurrently, while FIFO store 110 is capturing a sequence of sets of command and address values in FIFO registers 111–116, a corresponding sequence of program counter values is being captured by circuitry 130, which will now be described with reference to FIG. 5.

Figure 5:
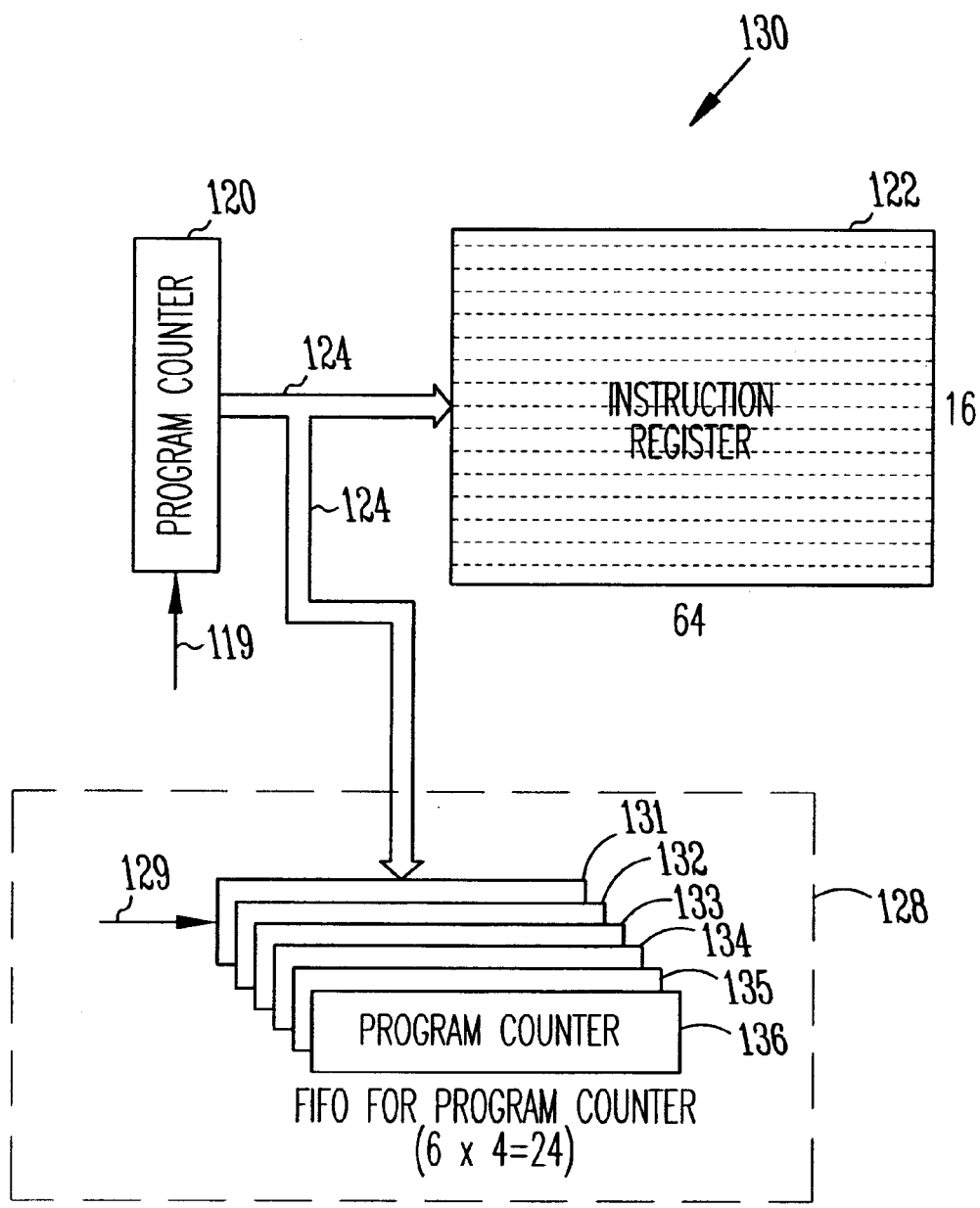
FIG. 5 illustrates another portion of an improved PBIST circuit, in accordance with one embodiment of the invention.

FIG. 5 illustrates another portion of an improved PBIST circuit 130, in accordance with one embodiment of the invention. Unlike the circuit illustrated in FIG. 2, which captures only one value of the program counter 20, PBIST circuit 130 can capture and store up to and including a predetermined number of program counter values in program counter 120 corresponding to the memory test instruction that exposes the first memory failure as well as to a number of subsequent instructions. It does this by successively storing the program counter values that appear in program counter 120 into a FIFO store 128 via bus 124.

In FIG. 5, instruction register 122 can be similar to or identical to instruction register 22 illustrated in FIG. 2.

FIFO store 128 comprises a plurality (e.g. six, in the example illustrated) of FIFO registers 131–136. In the embodiment illustrated, each FIFO register 131–136 can store one 4-bit program counter value. The storage of program counter values into FIFO registers 131–136 is controlled by suitable circuitry (not illustrated) that provides control signals to one or more control inputs 119 on program counter 120 and to one or more control inputs 129 on FIFO registers 131–136 in response to generation of a memory fault signal. The number of FIFO registers in FIFO store 128 is not limited to six, and it can be any suitable number that enables a sufficient number of program counter values to be captured and analyzed without requiring an excessive amount of silicon area for its implementation.

The program counter values stored in FIFO registers 131–136 can be used for subsequent analysis. For example, they can be used to re-run the PBIST engine to isolate memory faults in RAM 104, as will now be discussed below regarding FIGS. 6–8.

Figure 6:
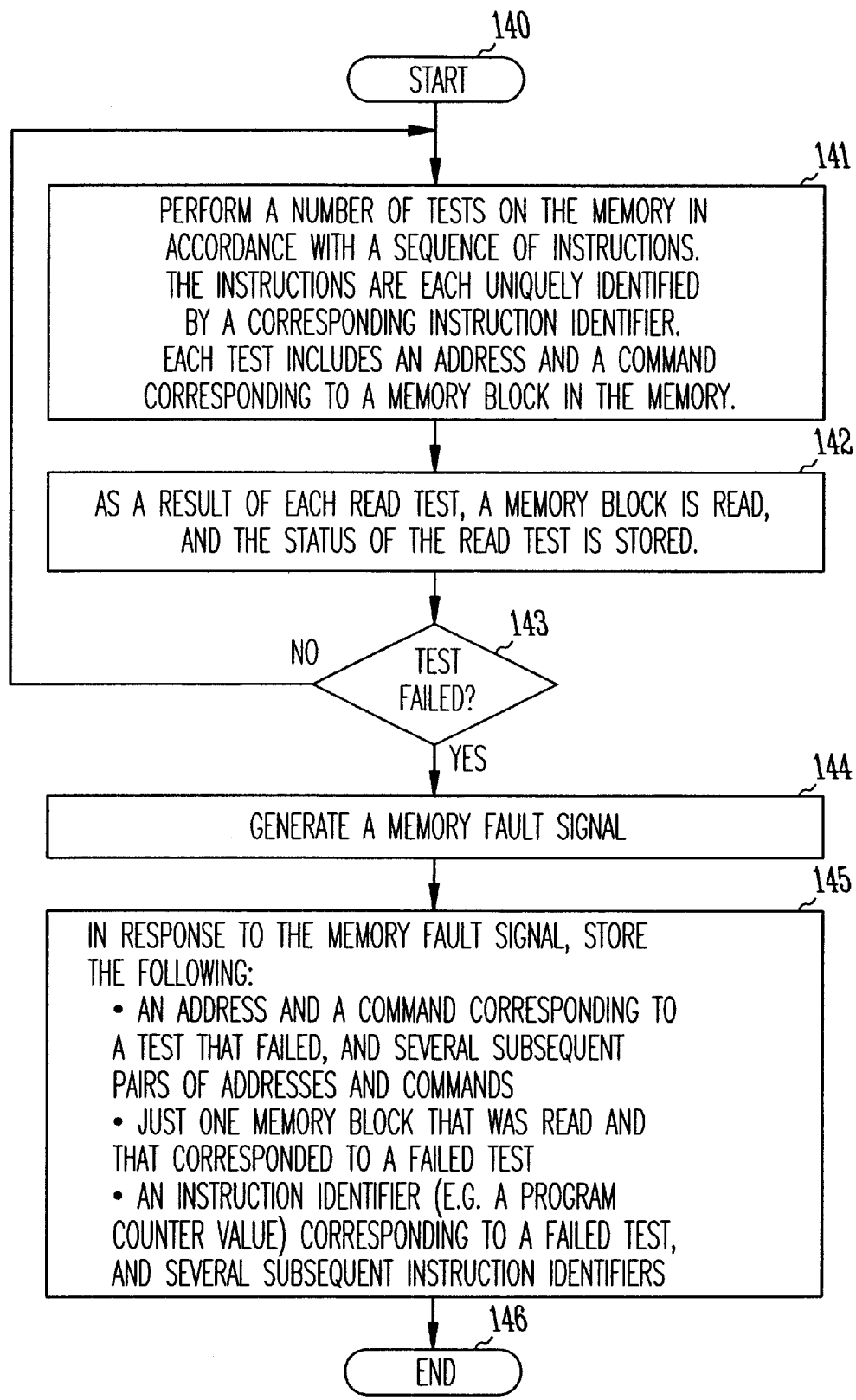
FIG. 6 illustrates a flow diagram of a method of operating an improved PBIST circuit to test a memory circuit, in accordance with one embodiment of the invention.

FIG. 6 illustrates a flow diagram of a method of operating an improved PBIST circuit to test a memory circuit, in accordance with one embodiment of the invention. The method starts at 140.

In 141, a number of tests are performed on the memory circuit in accordance with a sequence of instructions. The tests include one or more read tests. The test instruction sequence can comprise a set of PBIST instructions. Typical memory-testing instructions could include those mentioned in the above-referenced U.S. Pat. No. 5,640,509, such as successively writing a predetermined data pattern to each memory address, followed by successively reading each memory block and comparing its contents with the predetermined data pattern. However, the instruction sequence for testing the memory circuit is not limited to any particular one, and any suitable test instruction sequence can be employed.

Still regarding 141, each instruction in the test instruction sequence is uniquely identified by a corresponding instruction identifier. For example, the instruction identifier can be an address, including a program counter value, that points to a location in memory or in a register (including a program counter) where the instruction is stored.

Still regarding 141, each test comprises one or more addresses that correspond to one or more memory blocks in the memory circuit being tested. For example, one address can point to the first memory block into which the predetermined data pattern is to be written. Each test can also comprise a command portion. In its most basic form the command portion includes "write" and "read" commands, but it is not limited to these commands, and the command portion can be of any desired length and include any suitable commands.

In 142, as a result of each read test, a particular memory block of the memory circuit is read. If the read test results in a match, compared with the predetermined data pattern that was written to the memory block, a status bit having a first value (e.g. a binary 0) is stored; if the read test results in a mismatch, a status bit having a different value (e.g. a binary 1) is stored. The status value can be stored in an on-chip register, or it can be stored elsewhere, such as in another register within electronic system 50 or in main memory 62.

In 143, a determination is made whether the read test failed or not. If it failed, the method proceeds to 144; otherwise, it returns to 141, and the test sequence continues.

In 144, a memory fault signal is generated to reflect the fact that a memory test failed.

In 145, in response to the memory fault signal, a number of values are stored. These include the address and command corresponding to the test that failed. They also include several subsequent pairs of address and command values. In addition, data values are stored from just the one memory block whose read operation failed. (As will be discussed below regarding FIG. 7, this memory block can be the first memory block whose read operation failed, or it can be a subsequent memory block that is read during the process of analyzing the values that were captured following a memory fault signal.) In addition, the instruction identifier (e.g. an address or program counter value) corresponding to the test instruction that failed is stored. In addition, several subsequent instruction identifier values are also stored, up to the limit of the available storage depth of the program counter FIFO store 128.

Figure 7:
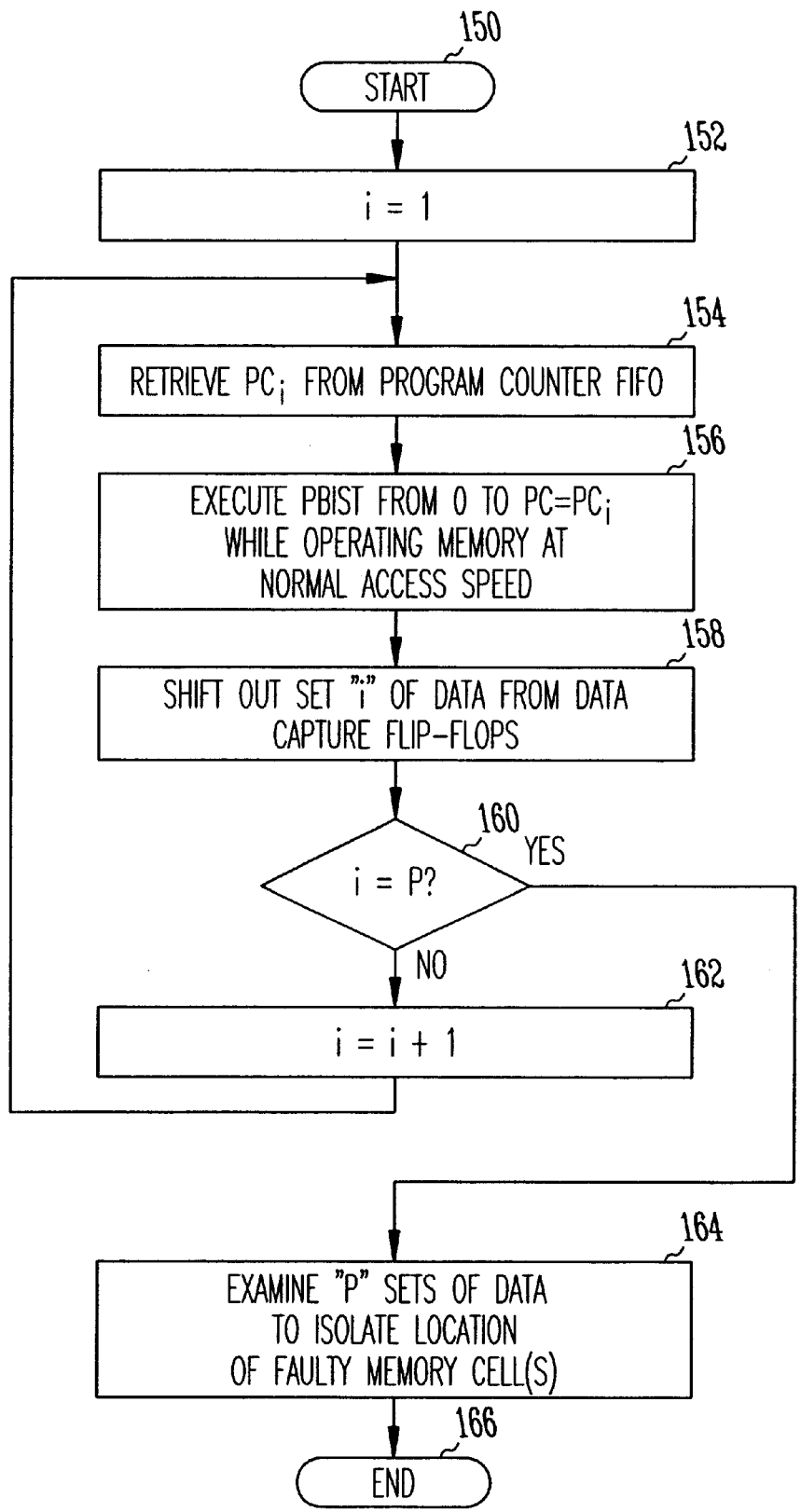
FIG. 7 illustrates a flow diagram of a method of operating an improved PBIST circuit to isolate a memory circuit fault, in accordance with one embodiment of the invention.

FIG. 7 illustrates a flow diagram of a method of operating an improved PBIST circuit to isolate a memory circuit fault, in accordance with one embodiment of the invention. The method illustrated in FIG. 6 is used to check the operation of RAM 104 while it is operating at its normal memory access speed, also referred to herein as "at speed". The method starts at 150.

In 152, index "i" is initialized to a value of "1".

In 154, the value $PC_i$ is retrieved from the program counter FIFO 128.

In 156, the PBIST engine is executed from instruction "0" up to and including $PC=PC_i$ while operating the memory circuit being tested at its normal access speed.

In 158, set "i" of data values is transferred (e.g. by shifting) out of the data capture flip-flops 106. Typically, these data values are transferred to an additional memory, which is coupled by a suitable bus to the data capture flip-flops 106, and which resides on a different integrated circuit than the memory circuit being tested. For example, they could be stored in main memory 62 (FIG. 3). However, the invention is not limited to architectures wherein the other memory is located on a different integrated circuit than the memory being tested.

In 160, a determination is made whether index "i"=P, where P represents the depth of the program counter FIFO store 128 (shown as having six FIFO registers in the example illustrated in FIG. 5). If so, the method proceeds to 164; otherwise, it proceeds to 162.

In 162, index "i" is incremented by a count of "1". The method then returns to 154.

When the method reaches 164, up to P sets of 1×480 data values have been captured in and transferred from the data capture flip-flops 106. Each set of 1×480 data values has been obtained by executing the PBIST engine beginning with instruction "0" and ending with program counter value $PC_1$, $PC_2$, $PC_3$, $PC_4$, $PC_5$, and $PC_6$, respectively. During each PBIST execution sequence, the memory circuit being tested has operated at its normal access speed, i.e. "at speed". This is important in order to identify memory faults that may only occur "at speed".

In 164, using known memory fault identification techniques, the up to P sets of data values are examined in order to isolate the location of faulty memory elements or cells. The method ends at 166.

Figure 8:
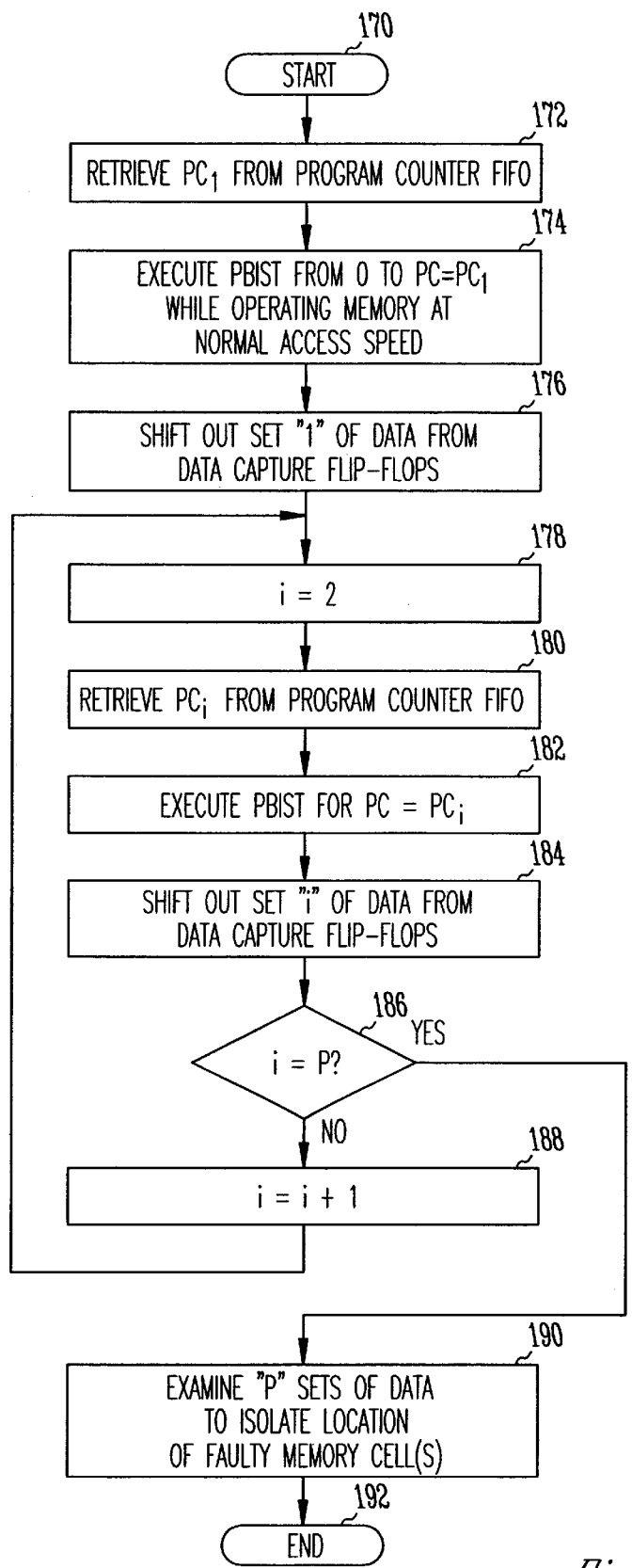
FIG. 8 illustrates a flow diagram of a method of operating an improved PBIST circuit to isolate a memory circuit fault, in accordance with another embodiment of the invention.

FIG. 8 illustrates a flow diagram of a method of operating an improved PBIST circuit to isolate a memory circuit fault, in accordance with another embodiment of the invention. The method illustrated in FIG. 7 is used to check the operation of RAM 104 while it is operating in a step-by-step test sequence rather than "at speed". The method begins at 170.

In 172, the value $PC_1$ is retrieved from the program counter FIFO 128.

In 174, the PBIST engine is executed from instruction "0" up to and including $PC=PC_1$ while operating the memory circuit being tested at its normal access speed.

In 176, set "1" of data values is transferred out of the data capture flip-flops 106. Again, these data values are typically transferred to a memory residing on a different integrated circuit than the memory circuit being tested. For example, they could be stored in main memory 62 (FIG. 3). However, the invention is not limited to architectures wherein the other memory is located on a different integrated circuit than the memory being tested.

In 178, index "i" is set to "2".

In 180, the value $PC_i$ is retrieved from the program counter FIFO 128.

In 182, the PBIST engine is executed for $PC=PC_i$.

In 184, set "i" of data values is transferred out of the data capture flip-flops 106.

In 186, a determination is made whether index "i"=P, where P represents the depth of the program counter FIFO store 128 (shown as having six FIFO registers in the example illustrated in FIG. 5). If so, the method proceeds to 190; otherwise, it proceeds to 188.

In 188, index "i" is incremented by a count of "1". The method then returns to 180

When the method reaches 190, up to P sets of 1×480 data values have been captured in and transferred from the data capture flip-flops 106. The first set of 1×480 data values was obtained by executing the PBIST engine beginning with instruction "0" and ending with program counter value $PC_1$, while the subsequent sets of 1×480 data values were obtained by stepping the PBIST engine through successive instructions corresponding to program counter values $PC_2$, $PC_3$, $PC_4$, $PC_5$, and $PC_6$, respectively. Ordinarily, each program counter value $PC_1$, $PC_2$, $PC_3$, $PC_4$, $PC_5$, and $PC_6$ represents the detection of a memory fault.

It will be noted that during the PBIST execution for program counter values $PC_2$, $PC_3$, $PC_4$, $PC_5$, and $PC_6$, the memory circuit being tested did not operate continuously at its normal access speed due to the time required to shift captured data values from the data capture storage element to the main memory.

In 190, using known memory fault identification techniques, the up to P sets of data values are examined in order to isolate the location of faulty memory cells. The method ends at 192.

The operations described above with respect to the methods illustrated in FIGS. 6–8 can be performed in a different order from those described herein.

CONCLUSION

The present invention provides for improved apparatus and methods for fault isolation in memory circuits. In one embodiment, a memory circuit to be tested forms part of a first integrated circuit that further includes at least a processor circuit. Various structures are also fabricated on the first integrated circuit for testing the memory circuit. These structures include storage elements for capturing and storing command, address, program counter, and data values while minimizing the silicon area used for such storage elements. In addition, an electronic assembly, an electronic system, a data processing system, and various methods of testing a memory have been described. All of these embodiments of the present invention provide testing, including PBIST testing, of memory circuits while minimizing the silicon area required for the structural elements that implement the memory testing, thus making such embodiments more commercially attractive than known apparatus and methods for performing memory testing.

As shown herein, the present invention can be implemented in a number of different embodiments, including an integrated circuit package, an electronic assembly, an electronic system, a data processing system, and various methods for testing memory. Other embodiments will be readily apparent to those of ordinary skill in the art. The elements, architecture, dimensions, and sequence of operations can all be varied to suit particular product and test requirements.

For example, FIFO stores 110 and 128 could be combined, or they could form portions of a larger FIFO. In addition, data capture flip-flops 106 and FIFO stores 110 and 128 can be implemented with any suitable memory storage or logic elements, such as dedicated RAM or registers.

The various elements depicted in the drawings are merely representational and are not drawn to scale. Certain proportions thereof may be exaggerated, while others may be minimized. The drawings are intended to illustrate various implementations of the invention, which can be understood and appropriately carried out by those of ordinary skill in the art.

Although specific embodiments have been illustrated and described herein, it will be appreciated by those of ordinary skill in the art that any arrangement that is calculated to achieve the same purpose may be substituted for the specific embodiment shown. This application is intended to cover any adaptations or variations of the present invention. Therefore, it is manifestly intended that this invention be limited only by the claims and the equivalents thereof.

What is claimed is:

1. An integrated circuit comprising:
   a processor comprising an instruction register to store a plurality of instructions, and a program counter to successively store a plurality of instruction identifiers each corresponding to a memory test instruction to be executed by the processor;
   a first first-in-first-out (FIFO) store coupled to the program counter to store a number of instruction identifiers;
   a memory coupled to the processor, the memory comprising a plurality of memory elements;
   an address register to successively store a plurality of addresses each corresponding to a memory block comprising a number of the memory elements;
   a second first-in-first-out (FIFO) store coupled to the address register to store a number of addresses; and
   a storage element coupled to the memory to store a single memory block.

2. The integrated circuit recited in claim 1 wherein the memory elements are arranged in an M×N array, M and N being positive integers, and wherein a memory block comprises N memory elements.

3. The integrated circuit recited in claim 1 wherein the memory elements are arranged in an M×N array, M and N being positive integers, and wherein the storage element comprises N flip-flops.

4. The integrated circuit recited in claim 1 wherein the address register additionally successively stores a plurality of commands each corresponding to a memory block, and wherein the second first-in-first-out (FIFO) store additionally stores a number of commands.

5. An electronic assembly comprising:
   a first integrated circuit including:
      a processor comprising an instruction register to store a plurality of instructions, and a program counter to successively store a plurality of instruction identifiers each corresponding to a memory test instruction to be executed by the processor;
      a first first-in-first-out (FIFO) store coupled to the program counter to store a number of instruction identifiers;
      a memory coupled to the processor, the memory comprising a plurality of memory elements;
      an address register to successively store a plurality of addresses each corresponding to a memory block comprising a number of the memory elements;
      a second first-in-first-out (FIFO) store coupled to the address register to store a number of addresses; and
      a storage element coupled to the memory to store a single memory block; and
   an additional memory on at least one additional integrated circuit, the additional memory being coupled to the storage element.

6. The electronic assembly recited in claim 5 wherein the memory elements are arranged in an M×N array, M and N being positive integers, and wherein a memory block comprises N memory elements.

7. The electronic assembly recited in claim 5 wherein the memory elements are arranged in an M×N array, M and N being positive integers, and wherein the storage element comprises N flip-flops.

8. The electronic assembly recited in claim 5 wherein the address register additionally successively stores a plurality of commands each corresponding to a memory block, and wherein the second first-in-first-out (FIFO) store additionally stores a number of commands.

9. An electronic system comprising an electronic assembly having an integrated circuit package comprising:
   a processor comprising an instruction register to store a plurality of instructions, and a program counter to successively store a plurality of instruction identifiers each corresponding to a memory test instruction to be executed by the processor;
   a first first-in-first-out (FIFO) store coupled to the program counter to store a number of instruction identifiers;
   a memory coupled to the processor, the memory comprising a plurality of memory elements;
   an address register to successively store a plurality of addresses each corresponding to a memory block comprising a number of the memory elements;
   a second first-in-first-out (FIFO) store coupled to the address register to store a number of addresses; and
   a storage element coupled to the memory to store a single memory block.

10. The electronic system recited in claim 9 and further comprising an additional memory on at least one additional integrated circuit package, the additional memory being coupled to the storage element.

11. The electronic system recited in claim 9 wherein the memory elements are arranged in an M×N array, M and N being positive integers, and wherein a memory block comprises N memory elements.

12. The electronic system recited in claim 9 wherein the memory elements are arranged in an M×N array, M and N being positive integers, and wherein the storage element comprises N flip-flops.

13. The electronic system recited in claim 9 wherein the address register additionally successively stores a plurality of commands each corresponding to a memory block, and wherein the second first-in-first-out (FIFO) store additionally stores a number of commands.

14. A data processing system comprising:
   a bus coupling components in the data processing system;
   a display coupled to the bus;
   external memory coupled to the bus; and
   an electronic assembly having an integrated circuit package including:
      a processor comprising an instruction register to store a plurality of instructions, and a program counter to successively store a plurality of instruction identifiers each corresponding to a memory test instruction to be executed by the processor;
      a first first-in-first-out (FIFO) store coupled to the program counter to store a number of instruction identifiers;
      a memory coupled to the processor, the memory comprising a plurality of memory elements;
      an address register to successively store a plurality of addresses each corresponding to a memory block comprising a number of the memory elements;
      a second first-in-first-out (FIFO) store coupled to the address register to store a number of addresses; and
   a storage element coupled to the memory to store a single memory block.

15. The data processing system recited in claim 14 wherein the external memory resides on at least one additional integrated circuit package that is coupled to the storage element.

16. The data processing system recited in claim 14 wherein the memory elements are arranged in an M×N array, M and N being positive integers, and wherein a memory block comprises N memory elements.

17. The data processing system recited in claim 14 wherein the memory elements are arranged in an M×N array, M and N being positive integers, and wherein the storage element comprises N flip-flops.

18. The data processing system recited in claim 14 wherein the address register additionally successively stores a plurality of commands each corresponding to a memory block, and wherein the second first-in-first-out (FIFO) store additionally stores a number of commands.

19. A method of testing a memory comprising a plurality of memory elements, the method comprising:

performing a plurality of tests, including read tests, on the memory in accordance with a sequence of instructions, the instructions each being uniquely identified by a corresponding instruction identifier, each test comprising an address corresponding to a memory block, and each read test resulting in a memory block being read;

generating a memory fault signal when one of the read tests fails; and in response to the memory fault signal, storing an address corresponding to the one read test, storing several subsequent addresses, and storing a read memory block corresponding only to the one read test.

20. The method recited in claim 19 wherein the memory is a component of an integrated circuit that further comprises a processor.

21. The method recited in claim 19 wherein each test additionally comprises a command, and wherein a command is concurrently stored whenever an address is stored.

22. The method recited in claim 19 and further comprising:

in response to the memory fault signal, storing an instruction identifier corresponding to the one read test, and further storing several subsequent instruction identifiers.

23. The method recited in claim 22 wherein the instructions reside in an instruction register, and wherein each instruction identifier comprises a program counter value.

24. The method recited in claim 22 and further comprising:

retrieving the instruction identifier corresponding to the one read test;

executing a sequence of instructions up to and including an instruction identified by the instruction identifier corresponding to the one read test; and storing the read memory block corresponding to the one read test to another memory.

25. The method recited in claim 24 wherein the memory is a component of an integrated circuit that further comprises a processor, and wherein the another memory is not located on the integrated circuit.

26. The method recited in claim 24 wherein in the executing operation the sequence of instructions are executed at the normal operational speed of the memory being tested.

27. The method recited in claim 24 and further comprising:

incrementing the instruction identifier by one count, resulting in an incremented instruction identifier;

executing a sequence of instructions up to and including an instruction identified by the incremented instruction identifier; and storing a read memory block corresponding to a test immediately subsequent to the one read test to the another memory.

28. The method recited in claim 27 and further comprising:

examining the stored read memory blocks and the stored addresses to isolate the location of one or more faulty memory elements in the memory being tested.

29. The method recited in claim 24 and further comprising:

incrementing the instruction identifier by one count, resulting in an incremented instruction identifier;

executing an instruction identified by the incremented instruction identifier; and storing a read memory block corresponding to a test immediately subsequent to the one read test to the another memory.

30. The method recited in claim 29 and further comprising:

examining the stored read memory blocks and the stored addresses to isolate the location of one or more faulty memory elements in the memory being tested.

* * * * *